United States Patent [19]

Bondur et al.

[11] 4,139,442
[45] Feb. 13, 1979

[54] REACTIVE ION ETCHING METHOD FOR PRODUCING DEEP DIELECTRIC ISOLATION IN SILICON

[75] Inventors: James A. Bondur, Walden; Hans B. Pogge, Hopewell Junction, both of N.Y.

[73] Assignee: International Business Machines Corporation, Armonk, N.Y.

[21] Appl. No.: 832,856

[22] Filed: Sep. 13, 1977

[51] Int. Cl.$^2$ .................................................. C23C 15/00
[52] U.S. Cl. ................................. 204/192 E; 156/643
[58] Field of Search ................ 204/192 E, 192 EC; 156/643, 657, 661

[56] References Cited

U.S. PATENT DOCUMENTS

| | | | |
|---|---|---|---|
| 3,489,656 | 1/1970 | Balde | 156/661 |
| 3,542,551 | 11/1970 | Rice | 156/661 |
| 3,575,740 | 4/1971 | Castrucci et al. | 156/657 |
| 3,649,396 | 3/1972 | Hatzakis | 156/643 |
| 3,823,015 | 7/1974 | Fassett | 156/661 |
| 3,966,577 | 6/1976 | Hochberg | 204/192 E |
| 3,998,673 | 12/1976 | Chow | 156/657 |

*Primary Examiner*—John H. Mack
*Assistant Examiner*—William Leader
*Attorney, Agent, or Firm*—Robert J. Haase

[57] ABSTRACT

A method for producing deeply recessed oxidized regions in silicon. A series of deep trenches are formed in a silicon wafer by a reactive ion etching (RIE) method. In a first species, the trenches are of equal width. A block-off mask is selectively employed during part of the RIE process to produce trenches of unequal depth. The trench walls are thermally oxidized to completely fill in all of the trenches with oxide at the same time. In a second species, the trenches are of equal depth and width and of uniform spacing. In one aspect of the second species, the width of the trenches is equal to the distance between the trenches whereby the thermal oxidation completely fills in the trenches with oxide at the same time that the silicon between the trenches is fully converted to silicon oxide. In another aspect of the second species, the trenches are wider than the distance between the trenches whereby the thermal oxidation only partially fills in the trenches with oxide when the intervening silicon is fully converted to silicon oxide. In the latter aspect, the filling of the trenches is completed by the deposition of suitable material such as pyrolytically deposited silicon oxide.

14 Claims, 12 Drawing Figures

REACTIVE ION ETCHING METHOD FOR PRODUCING DEEP DIELECTRIC ISOLATION IN SILICON

BACKGROUND OF THE INVENTION

Recessed dielectric isolation and, in particular, recessed silicon dioxide isolation are known in the large scale integrated semiconductor art for providing electrically isolated pockets on the same silicon chip, for separating base and collector contact regions of transistors constructed within isolated pockets, and for insulating conductors from the underlying silicon substrate. It is also known that recessed dielectric isolation can be produced by first selectively removing silicon from a substrate so as to form trenches in the substrate and then filling the trenches with dielectric material such as, for example, in the manner described in U.S. Pat. No. 3,966,577, issued on June 29, 1976 to Arthur K. Hochberg for Dielectrically Isolated Semiconductor Devices. This prior art teaches a structure but does not detail the process limitations or conditions to achieve that structure except in general terms.

In the interest of minimizing the silicon chip area occupied by the dielectrically filled trenches, sputter etching processes and reactive ion etching processes have been utilized to form the trenches in the silicon substrate. A reactive ion etching process is described in copending application Ser. No. 594,418, filed July 9, 1975, now abandoned, in the names of J. M. Harvilchuck et al for "Reactive Ion Etching of Silicon" and assigned to the present assignee, to provide trenches having vertical sidewalls without significant mask undercutting and the tapered walls which are characteristic of chemical etching processes.

In another copending application, Ser. No. 824,361 filed Aug. 15, 1977, now U.S. Pat. No. 4,104,086, for "Method For Forming Isolated Regions Of Silicon", in the names of the present inventors and assigned to the present assignee, a method for achieving well filled deep narrow grooves with near vertical walls is described. The method consists of the formation of slightly tapered narrow grooves cut through burried highly doped Si regions, thermal oxidation of said grooves and proper filling in of remaining grooves with a vapor deposited dielectric material. The application points out the need for forming slightly tapered walls and discusses the dependency of the quality and planarity of the dielectric filling material on the groove taper angle and groove width, respectively. The method also consists of a back etching of the filling material, which covers the total wafer, with reactive ion etching to remove the material everywhere from the surface to leave only the isolation pockets.

There remains a need, however, for a simplified process for simultaneously forming narrow deeply recessed dielectrically filled trenches of different depths for separating base and collector contact regions and for separating device areas of integrated transistor devices as well as for producing wide deeply recessed dielectrically filled trenches for isolating surface conductors from underlying silicon substrates. It is also desirable that these objectives be achievable by a single compatible series of process steps.

SUMMARY OF THE INVENTION

Nearly vertical walled, deeply recessed trenches are produced in silicon substrate material by reactive ion etching through an apertured mask. The resulting trenches are completely filled either by thermal oxidation or by a combination of thermal oxidation and the deposition of suitable material such as, for example, pyrolytically deposited silicon oxide or silicon nitride.

In one aspect of the invention, the apertured reactive ion etching mask is partially covered by a block-off mask during a portion of the etching process. The block-off mask is removed during a separate portion of the etching process whereby trenches of different depths are produced. When the widths of the trenches are made equal to each other, all of the trenches are completely filled with silicon dioxide by a single thermal oxidation step.

In another aspect of the invention, uniformly spaced trenches of equal depth are produced. When the widths of the trenches and the separation between trenches are made nominally equal to each other, all of the trenches are completely filled with silicon dioxide and the silicon material separating the trenches is completely converted to silicon dioxide by a single thermal oxidation step. When the trenches are significantly wider than the separation between the trenches, the trenches are partially filled in with silicon dioxide and the silicon material between the trenches is completely converted to silicon dioxide by a single thermal oxidation step. The remaining trench volume is completely filled in by the deposition of a suitable material.

DESCRIPTION OF THE PREFERRED EMBODIMENTS

Figure 1A:
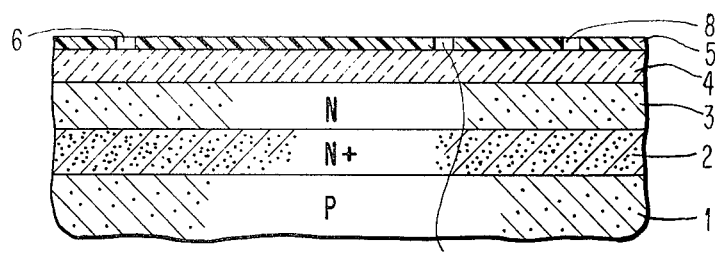
FIG. 1A through FIG. 1F are a series of simplified cross-sectional views of the formation of dielectrically filled trenches of different depths at various stages of the method of the present invention.

Referring to FIG. 1A, P substrate 1 is covered by blanket $N^+$ layer 2 and overlying blanket N layer 3 using conventional techniques. As indicated by the superscript "+", the concentration of the N dopant in layer 2 is higher than the concentration of the P dopant in substrate 1 whereby the conductivity of layer 2 is higher than the conductivity of substrate 1. The $N^+$ layer 2 serves as the subcollector of subsequently formed vertical bipolar transistors and as the junction ($N^+/P$) isolation portion of recessed oxide-junction isolated pockets to be formed in accordance with one aspect of the method of the present invention. Silicon oxide layer 4 of, for example, 5,000 Å thickness, is formed over N layer 3. Apertured resist layer 5 of, for example, about 2 microns thickness, is formed over the surface of oxide layer 4. Resist 5 can be any suitable material capable of withstanding reactive ion etching of the underlying oxide layer 4 through equal width apertures 6, 7 and 8. The reactive ion etching is accomplished using an RF voltage induced gaseous plasma formed in a low pressure ambient that at least includes a gas that disassociates to provide halogen ions or radical groups containing reactive halogen species, e.g., $CF_4$.

Figure 1B:
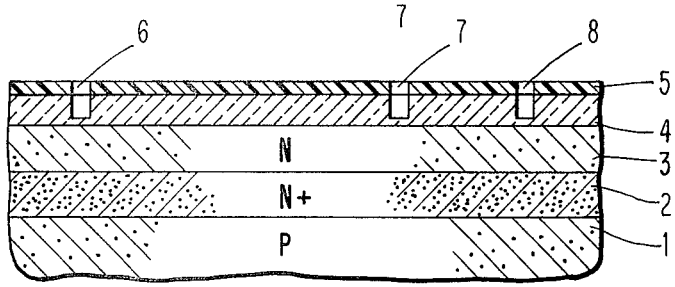

Using apertured resist mask 5, silicon oxide layer 4 is partially etched by reactive ion etching as shown in FIG. 1B. It is preferred that the width of the apertures 6, 7 and 8 be no greater than about 2 microns. The resist layer 5 can be type AZ 1350J commercially available from the Shipley Corporation and it optionally may be postbaked at temperatures up to about 115° C. prior to the reactive ion etching step. The reactive ion etching can be achieved using the apparatus described in the aforesaid copending patent application Ser. No. 594,418. An RIE power setting of about 0.32 watts/$cm^2$ and a $CF_4$ gas at a pressure of about 40 microns total pressure with 2-3 cc/min flow rate are suitable.

Figure 1C:
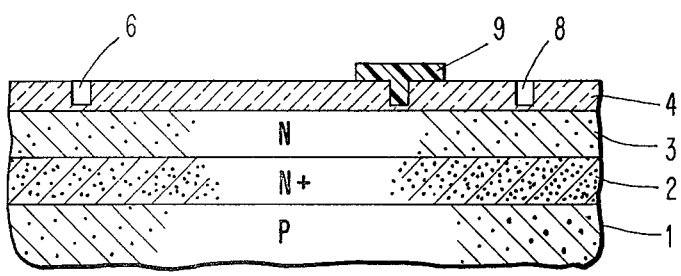
Figure 1D:
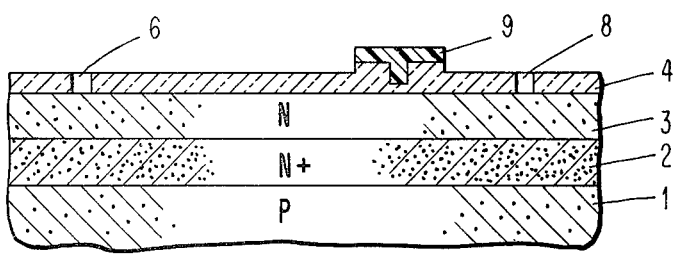

The reactive ion etching is interrupted when the trenches at locations 6, 7 and 8 incompletely penetrate oxide layer 4. Layer 5 is removed and block-off mask 9 then is placed over aperture 7 as shown in FIG. 1C. Mask 9 preferably uses the same resist material as layer 5. With block-off mask 9 in place, the reactive ion etching is reinitiated to complete the penetration of the trenches at locations 6 and 8 through oxide layer 4 as shown in FIG. 1D.

The etching is again interrupted, the block-off mask 9 is removed. Now the sample is exposed to a $Cl_2$/Ar RF induced plasma in the apparatus described in the aforesaid copending patent application Ser. No. 594,418. The $Cl_2$/Ar etch process is described in detail in the copending application Ser. No. 824,361. Using this technique, silicon is etched at an RF power level of 0.16 watts/$cm^2$ with a 3.5% $Cl_2$/Ar gas mixture at a total pressure of 10 microns. The etching penetrates N silicon layer 3 much more rapidly than in the case of silicon oxide layer 4. The result is that the trenches rapidly deepen through layer 3 at locations 6 and 8 during the time that the etching is being completed through layer 4 at location 7. Thus, the trenches at locations 6 and 8 penetrate through layers 3 and 2 and into layer 1 while the trench at location 7 only penetrates through layer 3 to reach layer 2 upon termination of the etching step as shown in FIG. 1E.

Figure 1E:
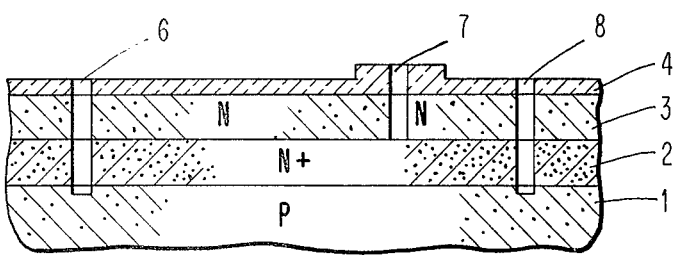
Figure 1F:
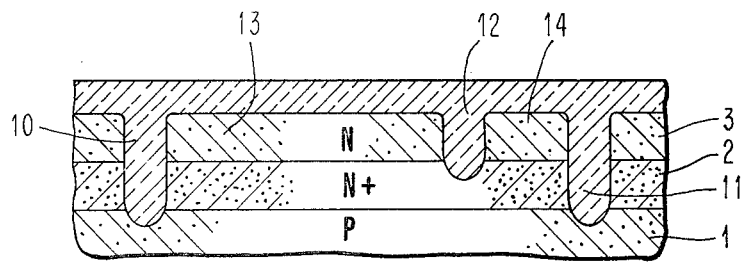

The structure shown in FIG. 1E is thermally oxidized in a conventional manner for a period of time sufficient for the growth of oxide along the vertical walls of the narrow trenches at locations 6, 7 and 8 to completely fill in the trenches to yield the structure shown in FIG. 1F. It should be noted that the trench at location 7 fills in with thermally grown oxide 12 at the same time that the trenches at location 6 and 8 are filled in with oxide 10 and 11 despite the different depths of the trenches. This result follows from the fact that all trenches are of equal width and are completely filled in primarily as the result of oxide growing at the same rate from the respective vertical walls of the trenches.

It will be appreciated by those skilled in the art that the structure of FIG. 1F comprises a pocket of N-doped silicon material which is electrically isolated from the P substrate 1 and from other similar pockets which are simultaneously produced elsewhere (not shown) on the same chip. The electrical isolation is provided by the vertical oxide walls 10 and 11 (which comprise an annular or closed configuration in plan view) in combination with the $N^+/P$ junction provided between layers 2 and 1. The oxide filled trench 12 serves to isolate N region 13 from N region 14 to facilitate the formation of base and emitter contact structure (not shown) in N region 13 and collector reachthrough contact structure (not shown) in N region 14 in a manner well known in the art such as, for example, is disclosed in U.S. Pat. No. 3,648,125, issued to Douglas L. Peltzer on Mar. 7, 1972 for Method Of Fabricating Integrated Circuits With Oxidized Isolation and the resulting structure. In general, the spacing between oxide walls 10 and 12 is greater than the spacing between oxide walls 12 and 11 to accomodate the greater area required by the base and emitter portions of a transistor (to be formed in N region 13) as compared to the smaller area required by the collector reachthrough portion (to be formed in N region 14).

With respect to the reactive ion etching of successive silicon layers with different impurity concentrations such as N-doped layer 3 and $N^+$-doped layer 2, it has been observed that the width of the resulting trench tends to be wider in the more heavily doped regions that in the more lightly doped regions. It is believed that this tendency is correlated to a somewhat higher temperature which occurs in the more heavily doped layer during etching as compared to the temperature which occurs in the less heavily doped area during etching. In any event, it has been found that the afore-described tendency can be minimized or eliminated by interrupting the etching procedure (by depowering the plasma generator) during the time that the trench is penetrating the more heavily doped layer. Such a "start-stop" etching procedure during penetration of the more heavily doped layer allows for cooling and produces a trench such as shown at locations 6 and 8 in FIG. 1E having a substantially uniform width throughout its depth.

Large scale integrated circuit chips not only contain a large number of isolated pockets, each including respective isolated semiconductor devices, but also provide for insulated surface conductors for the distribution of operating potentials and currents. Although said conductors are insulated from the semiconductor substrate (except where connection to circuit devices is required), a certain amount of capacitive coupling is present between the conductors and the substrate through the intervening insulating material. Such coupling, in general, is undesired and can be minimized by increasing the thickness of the dielectric material separating the conductors from the substrate. Inasmuch as it is advantageous that the conductors travel along a plane adjacent to the surface of the substrate, it is desirable that the bulk of the dielectric material be recessed below the surface of the substrate.

Figure 2A:
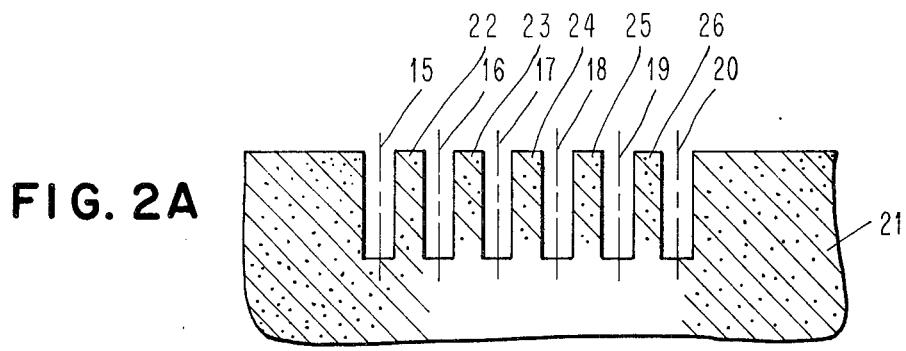
FIG. 2A through FIG. 2C are a series of simplified cross-sectional views of the formation of a deeply recessed and wide dielectric area at various stages in accordance with the thermal oxidation method of the present invention.

According to an aspect of the present invention, deeply recessed and wide regions of silicon oxide can be produced within a silicon substrate by a process fully compatible with the process described above for the production of oxide filled trenches of different depths. Referring to FIG. 2A, a plurality of trenches 15–20 are reactively ion etched into silicon substrate 21 by a process similar to that described in connection with FIGS. 1A and 1B. No block-off mask is employed (as in the case of FIG. 1C) for the reason that trenches 15–20 are desired to have not only the same width but also the same depth after the reactive ion etching process is completed. It is also preferred that the width of the trenches 15–20, like the width of the trenches of FIG. 1, be no greater than about 2 microns in order that they may be completely filled in with thermally grown oxide within a reasonable period of time.

As is well understood in the art, conventional thermally grown oxide grows outwardly from the surface of a silicon substrate at approximately the same rate that it penetrates into the silicon substrate. By making the ratio of the width of the trenches 15–20 with respect to the width of the pedestals 22–26 equal to the ratio of the growth rate of thermal oxide above the silicon substrate surface relative to the growth rate of the thermal oxide below the silicon substrate surface, the trenches 15–20 are completely filled in with thermal oxide at the same time that the silicon pedestals 22–26 are completely converted to silicon oxide by the same thermal oxidation process.

Figure 2B:
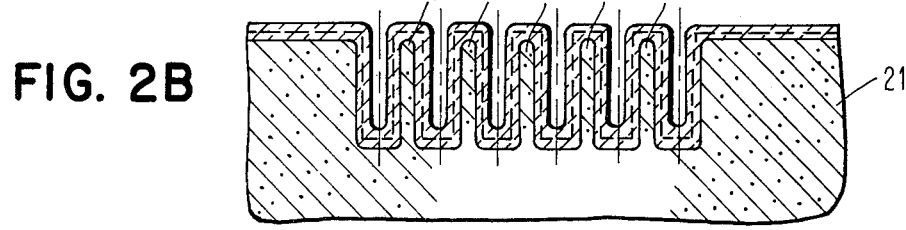
Figure 2C:
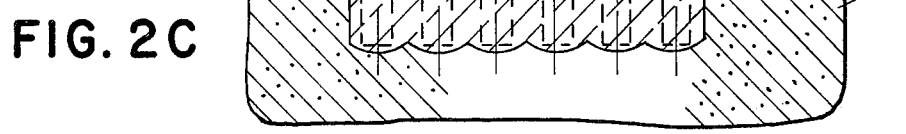

An intermediate stage in the thermal oxidation of the structure of FIG. 2A is shown in FIG. 2B. It will be noted that the silicon pedestals 22'–26' are reduced in width in FIG. 2B with respect to the width of pedestals 22–26 in FIG. 2A as the result of a certain amount of thermal oxidation. FIG. 2C shows the resulting structure after the thermal oxidation is continued to the point where the original trenches 15–20 are completely filled in with thermal oxide and the original pedestals 22–26 are completely converted to silicon oxide. Conductors (not shown) can be formed on the surface of the deeply recessed portion of the resulting oxide 27 with a minimum of capacitive coupling to substrate 21 due to the extended thickness (depth) of the intervening dielectric material.

Provision is made, in another aspect of the present invention, for the production of deeply recessed and wide regions of silicon oxide without requiring that the reactively ion etched trenches be entirely filled by thermal oxidation. As previously mentioned, trench widths no greater than about 2 microns are preferred in order to avoid inconveniently long oxidation times. Such narrow widths tax the limits of present day photolithography and often require the use of E-beam techniques for defining the apertures in the resist mask such as mask 5 of FIG. 1A and FIG. 1B. Wider apertures in excess of about 2 microns are relatively easily achieved using standard photolithography techniques but produce correspondingly wide trenches following the reactive ion etching step which trenches cannot be filled using conveniently short thermal oxidation times. According to the present invention, however, the trenches may be filled with dielectric material by a relatively simple modification of the process described in FIGS. 2A–2C.

Figure 3A:
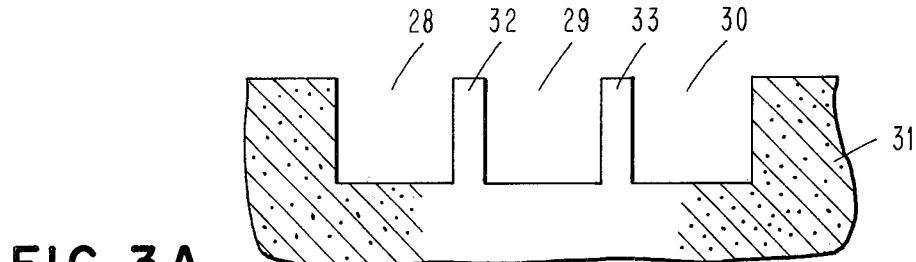
FIG. 3A through FIG. 3C are a series of simplified cross-sectional views of a deeply recessed and wide dielectric area at various stages in accordance with the combination thermal oxidation and material deposition method of the present invention.

Referring to FIG. 3A, relatively wide trenches 28, 29 and 30 are reactively ion etched into silicon substrate 31. As in the case of the multiple trenches 15–20 of FIG. 2, trenches 28, 29 and 30 are of equal depth and are separated by pedestals 32 and 33 which preferably are no wider than about 2 microns.

Figure 3B:
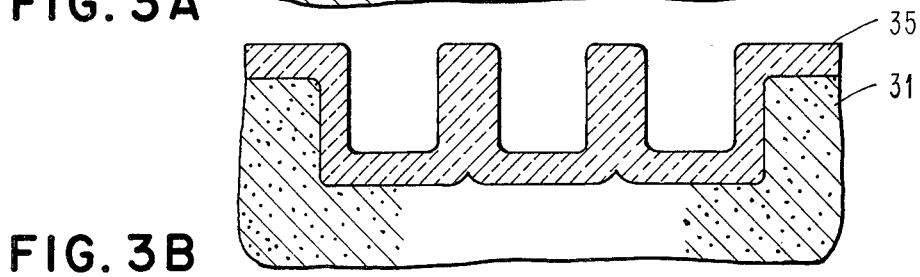
Figure 3C:
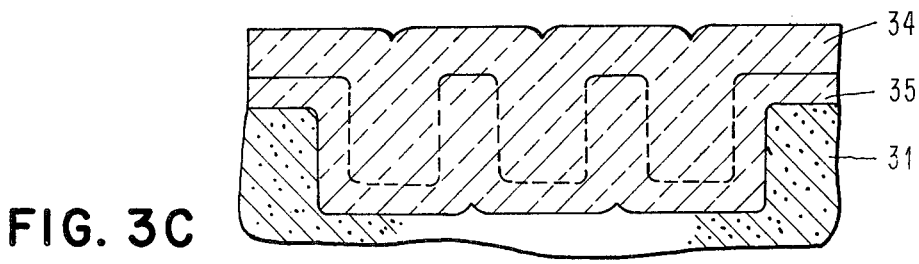

The structure of FIG. 3A is conventionally thermally oxidized until the silicon material of pedestals 32 and 33 is completely converted to silicon oxide as shown in FIG. 3B. The remaining unfilled portions of the trenches 28, 29 and 30 then are filled in by deposited material 34 as shown in FIG. 3C. Material 34 may be any material compatible with silicon substrate 31 and thermal oxide layer 35 such as, for example, pyrolytically deposited silicon dioxide, silicon nitride, aluminum oxide or polycrystalline silicon.

While the invention has been particularly shown and described with reference to the preferred embodiments thereof, it will be understood by those skilled in the art that various changes in form and details may be made therein without departing from the spirit and scope of the invention.

What is claimed is:

1. The process comprising: providing a silicon substrate,
   placing on said substrate a layer of material which is reactively ion etched at a substantially lower rate than said substrate,
   forming in said layer first openings of a given width which completely penetrate said layer to define first trench locations and second openings of said given width which incompletely penetrate said layer to define second trench locations, said first openings permitting reactive ion etching of said underlying substrate in an amount different from the amount of reactive ion etching of said underlying substrate permitted by said second openings,
   reactive ion etching said layer and said substrate to form in said substrate a plurality of equal width trenches having different depths relative to each other, and
   thermally oxidizing the walls of said trenches so as to completely fill in said trenches with thermally grown silicon oxide at substantially the same time.

2. The process defined in claim 1 wherein said layer is silicon dioxide.

3. The process defined in claim 1 wherein said silicon substrate comprises first and second layers of doped silicon material of different impurity concentration.

4. The process defined in claim 3 wherein said reactive ion etching is periodically interrupted during the time when said layer of doped silicon material having the higher impurity concentration is being penetrated by said etching.

5. The process defined in claim 1 wherein said silicon substrate comprises a first layer of a first conductivity type, a second layer of opposite conductivity type and higher conductivity than said first layer on said first layer and a third layer of said opposite conductivity type and lower conductivity than said second layer on said second layer.

6. The process defined in claim 5 wherein said reactive ion etching is periodically interrupted during the time when said second layer is being penetrated by said etching.

7. The process defined in claim 5 wherein the deeper trenches penetrate through said substrate to said first layer and the shallower trenches penetrate through said substrate to said second layer.

8. The process defined in claim 1 wherein said trenches have a width no greater than about 2 microns.

9. The process comprising:
   providing a silicon substrate,
   placing an apertured mask on said substrate,
   reactive ion etching said substrate through said mask to form a uniformly spaced series of trenches of the same width and of the same depth, and
   thermally oxidizing the walls of said trenches so as to completely convert the silicon between said trenches to silicon oxide.

10. The process defined in claim 9 wherein the width of said trenches is substantially equal to the distance between said trenches.

11. The process defined in claim 9 wherein the width of said trenches is no greater than about 2 microns.

12. The process defined in claim 9 wherein the width of said trenches is greater than the distance between said trenches.

13. The process defined in claim 12 and further including depositing dielectric material into said trenches subsequent to said thermally oxidizing step.

14. The process of reactively ion etching a channel into a semiconductor structure, said structure comprising a plurality of layers in overlying relationship, one of said layers having higher conductivity than the conductivity of another of said layers, placing an apertured mask on said structure, reactively ion etching said structure through said mask, and periodically interrupting said reactive ion etching during the time when said one of said layers is being penetrated by said etching.

* * * * *